(12) United States Patent (10) Patent No.: US 7,755,968 B2
Woo et al. (45) Date of Patent: Jul. 13, 2010

(54) INTEGRATED CIRCUIT MEMORY DEVICE HAVING DYNAMIC MEMORY BANK COUNT AND PAGE SIZE

(75) Inventors: Steven Woo, Saratoga, CA (US); Michael Ching, Los Altos, CA (US); Chad A. Bellows, Burlingame, CA (US); Wayne S. Richardson, Saratoga, CA (US); Kurt T. Knorpp, San Carlos, CA (US); Jun Kim, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/834,915

(22) Filed: Aug. 7, 2007

(65) Prior Publication Data

US 2007/0268765 A1 Nov. 22, 2007

Related U.S. Application Data

(63) Continuation of application No. 10/954,941, filed on Sep. 30, 2004, now Pat. No. 7,254,075.

(51) Int. Cl.
*G11C 8/00* (2006.01)
(52) U.S. Cl. ............................ 365/230.03; 365/185.11; 365/185.12
(58) Field of Classification Search ................. 365/220, 365/196, 205, 222, 230.03, 185.11, 185.12
See application file for complete search history.

(56) References Cited

U.S. PATENT DOCUMENTS 4,636,982 A 1/1987 Takemae et al.
4,670,745 A 6/1987 O'Malley et al.
4,766,538 A 8/1988 Miyoshi (Continued)

FOREIGN PATENT DOCUMENTS

EP 1248267 A 10/2002

(Continued)

OTHER PUBLICATIONS

Kirihata et al., "A 390-mm2, 16-Bank, 1-Gb DDR SDRAM with Hybrid Bitline Architecture," IEEE Journal of Solid-State Circuits, vol. 34, No. 11, Nov. 1999, pp. 1580-1588.

(Continued)

*Primary Examiner*—Richard Elms
*Assistant Examiner*—Han Yang
(74) *Attorney, Agent, or Firm*—Morgan, Lewis & Bockius LLP (57) ABSTRACT

An integrated circuit memory device has a storage array with an adjustable number of memory banks, a row of sense amplifiers to access storage cells in the storage array; and memory access control circuitry. The memory access control circuitry provides a first number of memory banks and a first page size in the integrated circuit memory device in a first mode of operation, and provides a second number of memory banks and a second page size in the integrated circuit memory device in a second mode of operation. The memory access control circuitry includes logic circuitry to adjust the number of memory banks in the integrated circuit memory device, and to adjust the page size of the integrated circuit memory device.

19 Claims, 7 Drawing Sheets

U.S. PATENT DOCUMENTS

| | | |
|---|---|---|
| 4,768,157 A | 8/1988 | Chauvel et al. |
| 4,837,465 A | 6/1989 | Rubinstein |
| 4,985,867 A | 1/1991 | Ishii et al. |
| 5,146,592 A | 9/1992 | Pfeiffer et al. |
| 5,222,047 A | 6/1993 | Matsuda et al. |
| 5,394,528 A | 2/1995 | Kobayashi et al. |
| 5,530,814 A | 6/1996 | Wong et al. |
| 5,546,346 A | 8/1996 | Agata et al. |
| 5,559,970 A | 9/1996 | Sharma |
| 5,614,855 A | 3/1997 | Lee et al. |
| 5,652,870 A | 7/1997 | Yamasaki et al. |
| 5,655,113 A | 8/1997 | Leung et al. |
| 5,717,871 A | 2/1998 | Hsieh et al. |
| 5,717,901 A | 2/1998 | Sung et al. |
| 5,748,561 A | 5/1998 | Hotta |
| 5,751,657 A | 5/1998 | Hotta |
| 5,787,267 A | 7/1998 | Leung et al. |
| 5,793,998 A | 8/1998 | Copeland et al. |
| 5,801,985 A | 9/1998 | Roohparvar et al. |
| 5,852,725 A | 12/1998 | Yen |
| 5,893,927 A | 4/1999 | Hovis |
| 5,933,387 A | 8/1999 | Worley |
| 5,936,885 A | 8/1999 | Morita et al. |
| 5,958,033 A | 9/1999 | Schubert et al. |
| 6,034,878 A | 3/2000 | Osaka et al. |
| 6,047,347 A | 4/2000 | Hansen et al. |
| 6,125,157 A | 9/2000 | Donnelly et al. |
| 6,138,185 A | 10/2000 | Nelson et al. |
| 6,141,273 A | 10/2000 | Ku et al. |
| 6,144,220 A | 11/2000 | Young |
| 6,144,577 A * | 11/2000 | Hidaka ........................ 365/63 |
| 6,240,039 B1 | 5/2001 | Lee et al. |
| 6,247,084 B1 | 6/2001 | Apostal et al. |
| RE37,409 E | 10/2001 | Barth et al. |
| 6,311,313 B1 | 10/2001 | Camporese et al. |
| 6,366,995 B1 | 4/2002 | Vilkov et al. |
| 6,393,543 B1 | 5/2002 | Vilkov et al. |
| 6,483,748 B2 * | 11/2002 | Futatsuya et al. ...... 365/185.11 |
| 6,625,687 B1 | 9/2003 | Halbert et al. |
| 6,754,120 B1 | 6/2004 | Bellows et al. |
| 6,762,948 B2 * | 7/2004 | Kyun et al. .................... 365/51 |
| 6,825,841 B2 | 11/2004 | Hampel et al. |
| 6,922,359 B2 | 7/2005 | Ooishi |
| 2001/0037428 A1 | 11/2001 | Hsu et al. |
| 2003/0002358 A1 * | 1/2003 | Lee et al. .................... 365/200 |
| 2003/0031052 A1 * | 2/2003 | Roohparvar et al. ... 365/185.11 |
| 2003/0052885 A1 | 3/2003 | Hampel et al. |
| 2003/0112675 A1 * | 6/2003 | Mukai et al. ................. 365/200 |
| 2003/0120836 A1 | 6/2003 | Gordon |
| 2003/0174573 A1 | 9/2003 | Suzuki et al. |
| 2004/0019756 A1 | 1/2004 | Perego et al. |
| 2004/0057284 A1 * | 3/2004 | Widmer et al. ......... 365/185.11 |
| 2004/0100823 A1 * | 5/2004 | Roohparvar ........... 365/185.11 |
| 2004/0120197 A1 | 6/2004 | Kondo et al. |

FOREIGN PATENT DOCUMENTS

| | | |
|---|---|---|
| EP | 0887737 B1 | 1/2003 |
| GB | 2367400 A | 1/2002 |
| WO | WO 91/16680 | 10/1991 |

OTHER PUBLICATIONS

Masumoto, "Configurable On-Chip RAM Incorporated Into High Speed Logic Array," Proceedings of the IEEE 1985 Custom Integrated Circuits Conference, May 20-23, 1985, pp. 240-243.

Satoh et al., "A209K-Transistor ECL Gate Array with RAM," IEEE Journal of Solid-State Circuits, vol. 24, No. 5, Oct. 1989, pp. 1275-1281.

S. Takase and N.i Kushiyama, "WP 24.1 A 1.6GB/s DRAM with Flexible Mapping Redundancy Technique and Additional Refresh Scheme," IEEE Journal of Solid State Circuits, vol. 34, No. 11, Nov. 1999, pp. 1600-1606.

S. Takase and N.i Kushiyama, "WP 24.1 A 1.6GB/s DRAM with Flexible Mapping Redundancy Technique and Additional Refresh Scheme," IEEE International Solid-State Circuits Conference, 4 pages plus ISSCC Slide Supplement pp. 348-349 and 506-507.

Ware, F., "Direct RDRAM 256/288-Mbit (512ks16/18×32s)," Rambus, Preliminary Information, Document DL0060 Version0.9, Aug. 1999, pp. 1-66.

Yoo, C et al., A 1.8V 700 Mb/s/pin 512Mb DDR-11 SDRAM with On-Die Termination and Off-Chip Driver Calibration, IEEE International Solid-State Circuits Conference ISSCC 2003/Session 17/SRAM and Dram/ Paper 17.7, pp. 312-313 and 496, plus Visuals Supplement on pp. 250-251 and 535.

Zhao, et al., TA 11.6 "An 18Mb, 12.3GB/s CMOS Pipeline-Burst Cache SRAM with 1.54Gb/s/pin," IEEE International Solid-State Circuits Conference, 1999, 10 pages.

Fairchild Semiconductor, "Design Optimization Techniques for Double Data Rate SDRAM Modules," Jul. 2000, 6 pages.

Fujitsu Semiconductor, "Memory CMOS 8×256zk×32 Bit Double Data Rate FCRAM, MB81N643289-50/-60," Data Sheet, Advance Information, AE0.5E, pp. 1-56.

Micron Technology, Inc., "Graphics DDR3 DRAM MT44H8M32-2 Meg ×32×4 Banks," Advance Data Sheet, Copyright 2003, pp. 1-67.

Micron Technology, Inc., "Synchronous DRAM," 1999, Preliminary 128 Mb: x4, x8, x16 SDRAM, pp. 1-53.

Micron Technology, Inc., "Micron Synchronous DRAM 128Mb:x32 SDRAM," pp. 1-52, Rev. Sep. 2000.

NVidia Corporation, "GeForce3: Lightspeed Memory Architacture," NVidia Corporation Technical Brief, pp. 1-9, date unknown.

Samsung Electronics, "SDRAM Device Operations," 41 Pages, date unknown.

IEEE 100 "The Authoritative Dictionary of IEEE Standards Terms," Seventh Edition, Critical piece first to Cross bar switch, (p. 252).

Minutes of Meeting No. 70, JC-42.3 Committee on RAM Memories, Mar. 9, 1994, Orlando, Florida, 72 pages (see, in particular, p. 62).

\* cited by examiner

INTEGRATED CIRCUIT MEMORY DEVICE HAVING DYNAMIC MEMORY BANK COUNT AND PAGE SIZE

RELATED APPLICATIONS

This application is a continuation of U.S. application Ser. No. 10/954,941, filed Sep. 30, 2004, now U.S. Pat. No. 7,254,075, which is incorporated herein by reference in its entirety.

FIELD OF THE INVENTION

The present invention relates to high speed signaling.

BACKGROUND

A memory system typically includes a master device, such as a processor or memory controller, and a plurality of integrated circuit memory devices for storing data. An integrated circuit memory device typically includes a plurality of storage cells, arranged in an array or memory bank, for storing data. The integrated circuit memory device may include a plurality of memory banks.

Data is written to and read from the integrated circuit memory device in response to one or more commands included in read and/or write transactions between the integrated circuit memory device and the master device. For example, data is generally transferred from one or more memory banks to a plurality of sense amplifiers in response to an ACTIVATE (ACT) command on a control interconnect. The data may then be transferred from the plurality of sense amplifiers to an integrated circuit memory device interface and onto a data interconnect in response a READ (RD) command on the control interconnect.

Data stored in the plurality of storage cells is typically accessed from one row of storage cells at a time. An accessible row of storage cells is typically referred to as "a page." A page may be accessed from one or more memory banks in one or more integrated circuit memory devices. A column address, which may be included in a request packet or with a command from the master device, is often provided to an integrated circuit memory device to access data from a page selected by a row address. The latency or time required to access data from an already selected page is generally lower than the latency to access data from a page that must be first selected.

In certain memory system applications, a large number of memory banks (or large bank count) and small page sizes may be desirable while in other memory system applications a relatively smaller number of memory banks and larger pages sizes are desirable. For example a computational application, such as a general-purpose computer, blades or servers, typically has a large number of integrated circuit memory devices and a large number of memory banks to support multiple software applications and threads. In this type of system, the integrated circuit memory devices are often placed on memory modules. A set of integrated circuit memory devices on one or more memory modules (for example, all of the devices on two modules, all of the devices on one module, half of the devices on one module, or half of the devices on each of two modules) are further grouped into a rank of devices. A rank of devices responds together to read and write commands. By having multiple integrated circuit memory devices respond to each read and write command, memory bandwidth can be increased for reads and write transactions. Typically, pages span all the integrated circuit memory devices in a rank, resulting in "physical" page sizes that can be very large. Physical pages may end up being larger than an operating system's page size. In some situations, smaller per integrated circuit memory device page sizes are desirable in order to allow the aggregate page size that spans the rank of devices to match an operating system's page size so that performance is increased, and power consumption can be reduced. In contrast, systems with a lot of graphics processing, such as a game consoles, high-definition televisions, or television set top boxes typically have a relatively small number of integrated circuit memory devices and memory banks. In these systems, it can often be desirable to have large per integrated circuit memory device page sizes so that the aggregate page size that spans the rank of devices is large enough to provide good performance and lower power consumption. Because systems designers and end-users can benefit from having the same integrated circuit memory device used in multiple applications, it is desirable to have an integrated circuit memory device support multiple page sizes.

Accordingly, it is desirable to have a memory system, in particular an integrated circuit memory device that meets the various operational or application needs of an end-user.

In addition, it is desirable to have a memory system that is backwards compatible. For example, a graphics application of a memory system should be able to execute older game software requiring a particular memory bank count and page size to match the timing and execution characteristics of the older memory system, while also being able to execute newer game software that takes advantage of a different memory system having a different memory bank count and page size. Likewise, an integrated circuit memory device should be able to operate with different types of memory controllers having different types of operating system software (older and newer versions) that access different numbers of memory banks and/or page sizes.

DETAILED DESCRIPTION

A memory system includes a master device, such as processor or a graphics controller, and an integrated circuit memory device operable in a dynamic memory bank count and page size mode. The integrated circuit memory device includes a first and second row of storage cells coupled to a row of sense amplifiers including a first and second plurality of sense amplifiers. During a first mode of operation, a first plurality of data is transferred from the first plurality of storage cells in the first row to the sense amplifiers. During the second mode of operation (or dynamic memory bank count and page size mode), a second plurality of data is transferred from the first row of storage cells to the first plurality of sense amplifiers and a third plurality of data is transferred from the second row of storage cells to the second plurality of sense amplifiers. The second and third plurality of data is accessible simultaneously from the memory device interface during the second mode of operation.

In an embodiment, the second plurality of data is transferred from the first half (or other subset) of the first row and the third plurality of data is transferred from the second half (or other subset) of the second row.

In an embodiment, the integrated circuit memory device operates at full bandwidth in either the first or second mode of operation.

Figure 7:
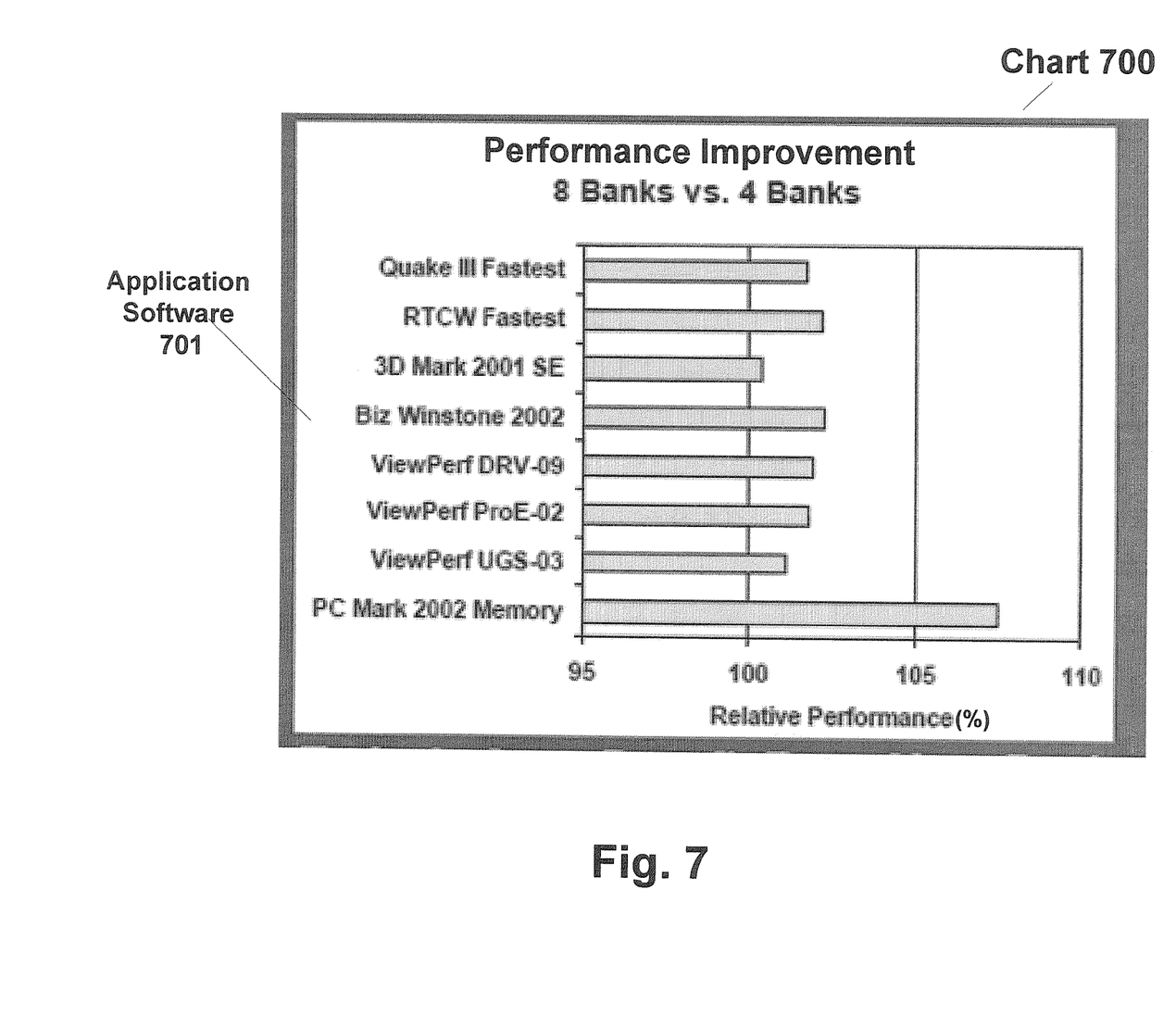
FIG. 7 illustrates performance improvement of software applications executing on a memory system having increased memory banks.

By being able to adjust or dynamically change the bank count or number of addressable memory banks (using either physical or virtual memory banks) and page size (either at initialization or during operation) accessed by the master device, a memory system may be able to achieve a number of advantages. First, application software may perform or operate more quickly depending upon the number of memory banks available. FIG. 7 is a performance chart 700 comparing the performance improvements of a plurality of application software 701 executed on a four and eight memory bank memory system. As can be seen, all the application software 701 have between an approximate 1 and 8% performance increase when executed on an eight memory bank system as compared to a four memory bank system. Accordingly, application software can include software code or machine-readable instructions for changing the number of addressable memory banks and page size to optimize performance. Or alternatively, an operating system or other software may alter the number of addressable memory banks and page size when it determines the application software is or will be executing.

Second, the number of addressable memory banks and page size may be altered depending upon the configuration or memory system application. For example, a game console manufacturer or designer is interested in a memory system having a relatively small number of memory banks and a large page size; while a general purpose computer manufacture is interested in a memory system having a relatively larger number of memory banks and smaller page size per integrated circuit memory device. Accordingly, an integrated circuit memory device manufacturer or designer can sell the same or similarly configured memory systems to both markets. Furthermore, a dynamic memory bank count and page size system allows for backward compatibility or the ability to use older as well as newer versions of master device software and/or application software. Memory system or device manufacturers can provide memory systems that operate with older software that requires a certain memory bank count and page size as well as new version software that may require a different memory bank count and page size to perform optimally.

Third, the number of addressable memory banks may be decreased for certain integrated circuit memory device operations and increased for other integrated circuit memory device operations to enhance memory system performance. For example, the number of memory banks may be decreased (or only physical memory banks are addressed) for REFRESH memory device operations or display screen refresh and increased (addressing virtual memory banks) for all other memory operations.

Fourth, memory bank count and page size may be altered to reduce power consumption or reduce temperature which may increase performance and reduce bit error rates.

Figure 1:
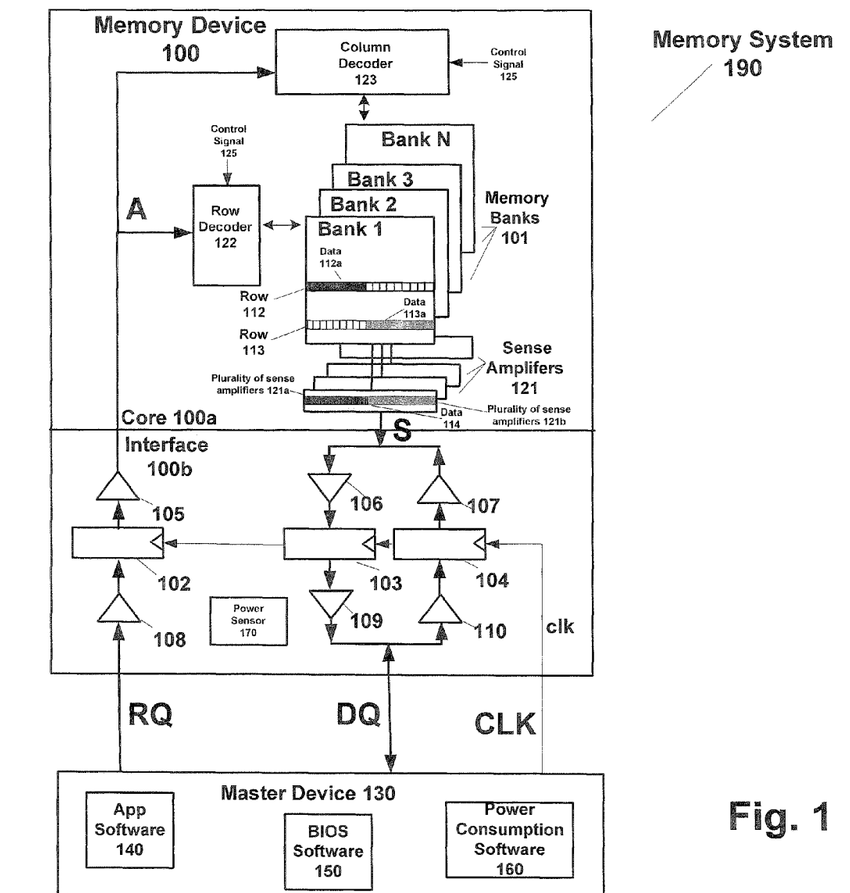
FIG. 1 is a block diagram of a memory system including an integrated circuit memory device and master device.

FIG. 1 illustrates a memory system 190 including an integrated circuit memory device 100, operable in a first and second mode, coupled to master device 130 by interconnects RQ and DQ. Integrated circuit memory device 100 includes N physical memory banks 101, in a memory core 100*a*, and an interface 100*b*.

Memory banks 101 include individual memory banks having a two dimensional array of storage cells. In an embodiment, memory banks 101 include 16 memory banks. In an embodiment, a memory bank includes 2048 rows of storage cells or pages. Each row includes 64 addressable columns that each store 16 bytes of information. In embodiments, storage cells of memory banks 101 may be dynamic random access memory (DRAM) cells, static random access memory (SRAM) cells, read-only memory (ROM) cells, or other equivalent types of memory storage cells. In an embodiment, integrated circuit memory device 100 is an XDR™ DRAM integrated circuit memory device provided by Rambus Inc. of Los Altos, Calif., USA.

Reading and writing to memory bank(s) 101 are initiated by row decoder 122 and column decoder 123 in response to row and column addresses, respectively. A plurality of storage cells or row 112 (also referred to as a page) outputs a plurality of data 112*a* (or set of data) to sense amplifiers 121 (in particular a first plurality of sense amplifiers 121*a* coupled to memory bank 1) in response to a first row address provided to row decoder 122 on internal interconnect A. Likewise, a plurality of storage cells or row 113 outputs a plurality of data 113*a* to sense amplifiers 121 (in particular a second plurality of sense amplifiers 121*b* coupled to memory bank 1) in response to a second row address provided to row decoder 122 and a second column address or addresses provided to column decoder 123. Thus, data 114 in the first and second plurality of sense amplifiers 121*a* and 121*b* consists of data 112*a* from row 112 and data 113*a* from row 113.

Memory device 100 includes an internal interconnect A for providing control and address signals for addressing a storage location in memory banks 101. Interconnect A is coupled to circuitry 105 for coupling interface 100*b* to core 100*a*. Pipeline register 102 is coupled to circuitry 105 and receiver 108. External interconnect RQ is coupled to receiver 108 and carries external control and address signals between interface 100*b* and master device 130. In an embodiment, interconnect RQ is a unidirectional control bus having a plurality of signal lines. Internal interconnect S, in an embodiment, is an internal bidirectional bus for providing read/write data signals between sense amplifiers 121 and memory banks 101. Interconnect S is coupled to circuitry 106 and 107 for coupling interface 100*b* to core 100*a*. Pipeline registers 103 and 104 are coupled to circuitry 106 and 107, respectively. Transmitter 109 and receiver 110 are coupled to pipeline registers 103 and 104, respectively. An external interconnect DQ transfers external bidirectional read/write signals and is coupled to transmitter 109 and receiver 110 as well as master device 130. In an embodiment, interconnect DQ is a bidirectional data bus having a plurality of signal lines.

Column decoder 123 allows independent access to one or more addressable columns in a selected row 112 or 113 during a column cycle time interval $t_{CC}$ in response to one or more column addresses provided on internal interconnect A. In an embodiment, column decoder 123 and row decoder 122 are configured to dynamic memory bank count and page size mode addressing decoders in response to a mode control signal 125. As described below, in response to a mode control signal 125, row decoder 122 addresses two separate rows and column decoder 123 addresses bits from the separate halves (or subsets) of the two separate rows during a column cycle time interval $t_{CC}$. In an embodiment, column decoder 123 operates during a column cycle time interval $t_{CC}$ and row decoder 122 operates during a time interval $t_{RR}$ as described below. In particular, data is transferred from storage cells in memory banks 101 to sense amplifiers 121 in response to a row address provided to row decoder 122 and one or more column addresses are provided to column decoder 123 to transfer data from the plurality of sense amplifiers 121 to interconnect S.

In an embodiment, mode control signal 125 is provided from an initialization register, or a bit value in an initialization register, at memory system 190 initialization or power-up. In an embodiment, a serial presence detect (SPD) device that is a non-volatile memory device generates a mode control signal 125. An SPD device is a non-volatile memory device that may be included on a memory module, such as a dual-inline memory module (DIMM), or elsewhere in memory system 190 in embodiments. The SPD device stores information used by system 190 to properly configure integrated circuit memory device 100 upon boot or initialization of system 190. In an embodiment, system 190 reads information from a SPD device and writes the information to a register positioned on memory device 100 to store a value that represents a desired mode. The register that stores the value can be used to generate mode control signal 125.

In an alternate embodiment, mode control signal 125 is provided by master device 130 by way of interconnect RQ and internal interconnect A at initialization or during typical operation. In an embodiment, mode control signal 125 is provided in a request packet or within a memory command generated by master device 130.

In an embodiment, master device 130 generates a mode control signal 125 in response to the execution of machine-readable instructions or software stored on or accessible to master device 130. For example, application (App) software 140, such as game software, basic input/output system (BIOS) software 150 and/or power consumption software 160 may cause master device 130 to generate a mode control signal 125. App software 140, BIOS software 150 and/or power consumption software 160 includes machine readable instructions for determining a state, such as a memory system 190 configuration (i.e. number of memory devices, number of memory banks per memory device, number of memory modules, etc.), execution of a particular version of game software or power consumption of memory system 190 or a component of memory system 190. Based upon the determined state by the software, mode control signal 125 is generated during operation or at initialization of memory system 190.

In an embodiment, memory device 100 includes a power sensor 170 for providing a power consumption value to master device 130 and in particular power consumption software 160. In an embodiment, power consumption software 160 uses the power consumption value to determine whether to adjust the memory bank count and page size. As one of ordinary skill in the art would appreciate, power sensor 170 may be placed at or near other components of system 190, including master device 130 or on a substrate of a memory module that positions memory device 100.

The pipeline registers 102, 103, and 104 are used for synchronization of the information between the internal and external interconnects. Registers 102-104 may also be used for generating delay, as would be required if the internal and external interconnects used a different number of signals. Although memory device 100 shows a single level (clock cycle) of pipeline registers, two or more levels (clock cycles) of delay are used in alternative embodiments.

In an embodiment, differential signals are transferred between memory device 100 and master device 130 on interconnect RQ, interconnect DQ and a CLOCK (CLK) line.

A CLK line provides a clock signal clk to registers 102-104 for synchronizing integrated circuit memory device 100 transactions. In other embodiments, the clock signal clk serves as a reference for a clock recovery circuit component that includes either a phase lock loop or delay lock loop circuit, which generates clocking signals within integrated circuit memory device 100. In an embodiment, a clock signal clk is provided to integrated circuit memory device 100 by master device 130. In alternate embodiments, a clock signal clk is provided by another source, such as a clock generator. In an embodiment, interface 100b includes a plurality of conducting contacts, such as pins and/or balls, for coupling to interconnect RQ, interconnect DQ and one or more CLK lines.

In embodiments, interconnects described herein include a plurality of conducting elements or conducting paths such as a plurality of wires and/or metal traces/signal lines. In an embodiment, a single conducting path illustrated in the Figures may be replaced by multiple conducting paths and multiple signal paths illustrated in the Figures may be replaced by a single conducting path. In embodiments, an interconnect may include a bus and/or point-to-point connection. In an embodiment, interconnects include control and data signal lines. In an alternate embodiment, interconnects include only data lines or only control lines. In still other embodiments, interconnects are unidirectional (signals that travel in one direction) or bidirectional (signals that travel in two directions).

In embodiments, master device 130 is a general-purpose processor, memory controller, network controller, high definition television processor, set top box processor, game console processor, graphics controller or an equivalent.

In an embodiment, integrated circuit memory device 100 is positioned on a substrate in a memory module having multiple integrated circuit memory devices. In an alternate embodiment, master device 130, memory device 100 and associated interconnects are in an integrated monolithic circuit.

Figure 2:
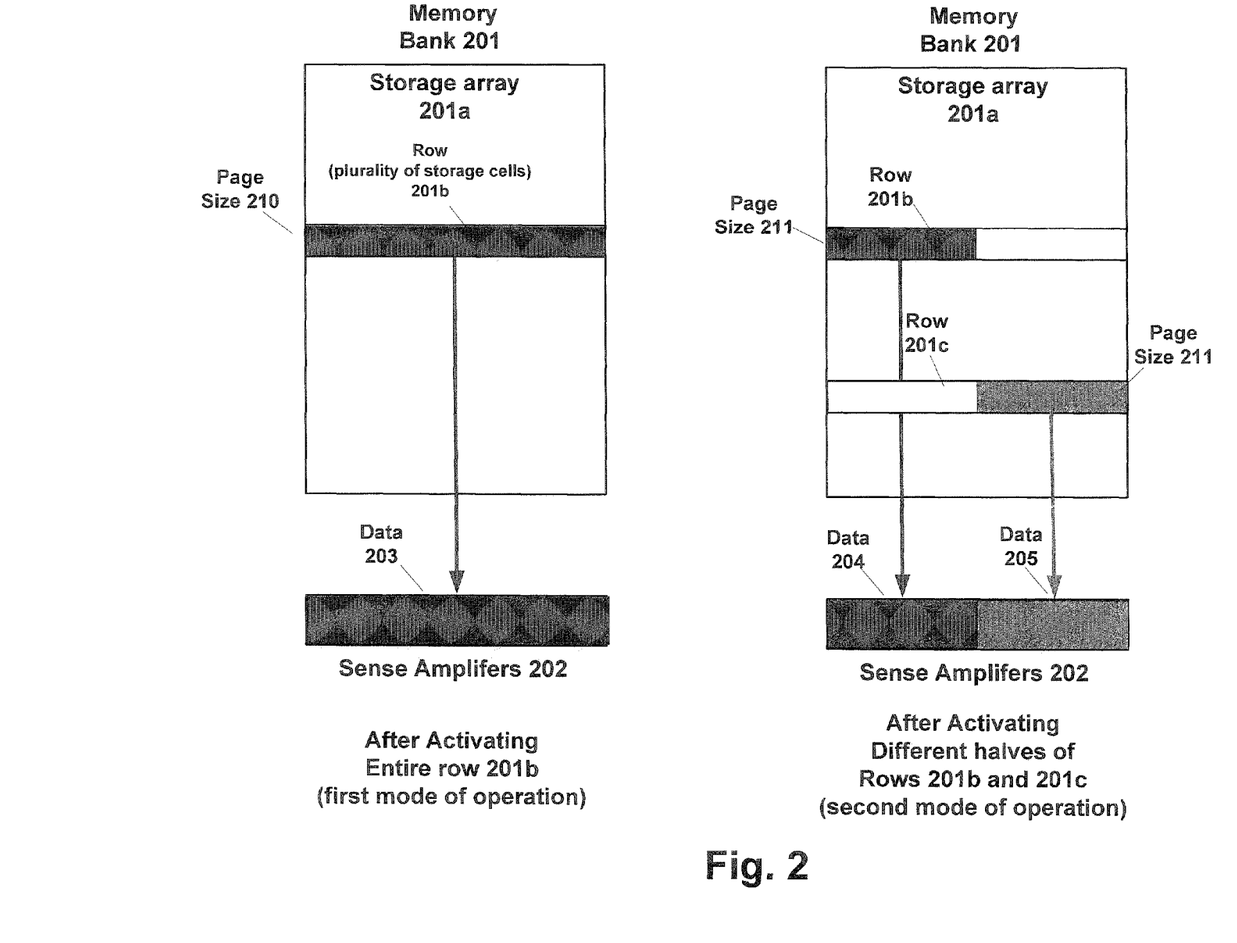
FIG. 2 is a block diagram illustrating a first and second mode of operation of the integrated circuit memory device shown in FIG. 1.

FIG. 2 is a block diagram illustrating a first and second mode of operation of the integrated circuit memory device 100 shown in FIG. 1. In an embodiment, memory bank 201 having storage array 201a and sense amplifiers 202 refer to memory bank 1 and plurality of sense amplifiers 121a and 121b shown in FIG. 1. In a first mode of operation, a first row or plurality of storage cells 201b storing data 203 are addressed and then transferred to sense amplifiers 202 during a time interval $t_{RR}$. In this mode of operation, the plurality of storage cells 201b storing data 203 defines a page size 210. In other embodiments, memory bank 201 as well as other memory banks in different integrated circuit memory devices may be accessed simultaneously and page size 210 is a portion of the entire accessible page size spanning multiple integrated circuit memory devices.

Figure 3:
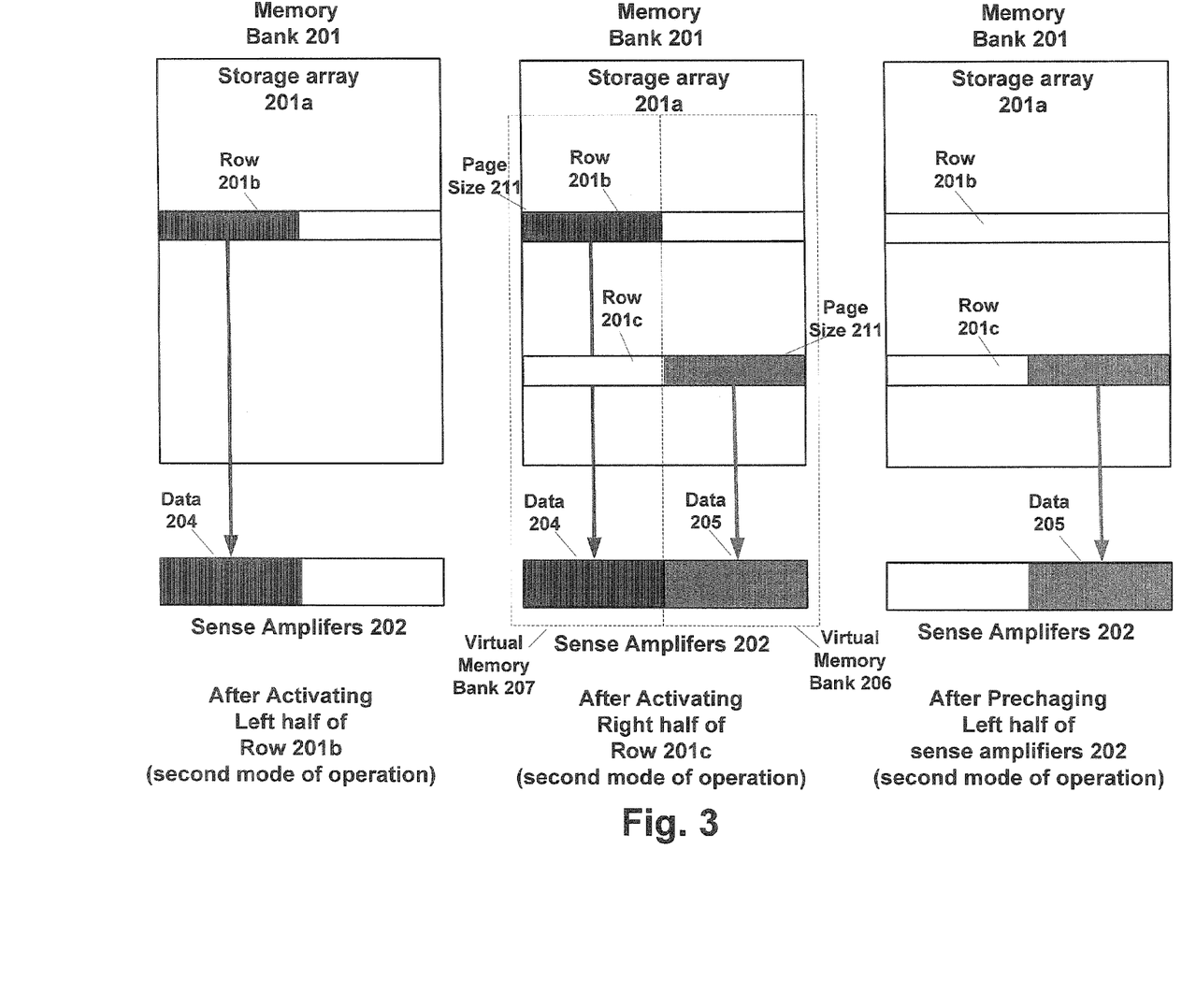
FIG. 3 is a block diagram illustrating the second mode of operation of the integrated circuit memory device shown in FIG. 2.

In a second mode of operation, different halves of different rows (row 201b and 201c) of storage array 201a are accessed in a time interval $t_{RR}$. Data 204 is transferred from a first half of row 201b to a first plurality of sense amplifiers in sense amplifiers 202 while data 205 from a second different half of a different row 201c is transferred to a second plurality of sense amplifiers in sense amplifiers 202. As can be seen in FIG. 3, in the second mode of operation a physical memory bank 201 having a page size of 210 is altered to appear to a master device 130 to have twice as many memory addressable memory banks or virtual memory banks 207 and 206 and half as large a page size 211 as compared to page size 210 in the first mode of operation. In an embodiment, the entire data stored in a first half of row 201b is provided to sense amplifiers 202 and the entire data stored in the second half of row 201c is provided to sense amplifiers 202. Accordingly, master device 130 or another device can change the mode of operation of memory device 100 to include more virtual memory banks and smaller page sizes if such a configuration is appropriate or advantageous.

In an embodiment, power consumption savings is achieved by transferring only a half of a selected row, as compare to transferring entire rows, in the second mode of operation.

While the second mode of operation has been described in terms of transferring data from half a row in the storage array 201a to sense amplifiers 202, in alternate embodiments data stored in a quarter of a row or other subset of an entire selected row may be transferred from a selected quarter or subset of the row to the sense amplifiers 202.

FIG. 3 is a block diagram illustrating the second mode of operation of the integrated circuit memory device shown in FIG. 2. A left half of row 201b is activated and data 204 is transferred from the left half of row 201b to a first plurality of sense amplifiers in sense amplifiers 202. Virtual memory banks 207 and 206 are then formed (from physical memory bank 201) or are addressable from master device 130. Likewise, a right half of row 201c is activated and data 205 is transferred from the right half of row 201c to a second plurality of sense amplifiers in sense amplifiers 202. Data 204 and 205 (from two different rows) are then stored in sense amplifiers 202 and are simultaneously accessible from interconnect DQ. In an embodiment, a subset of sense amplifiers 202 can be precharged or the left half of row 201b is closed. In an alternate embodiment, other subsets of sense amplifiers 202 are precharged in response to precharge addresses.

Figure 4A:
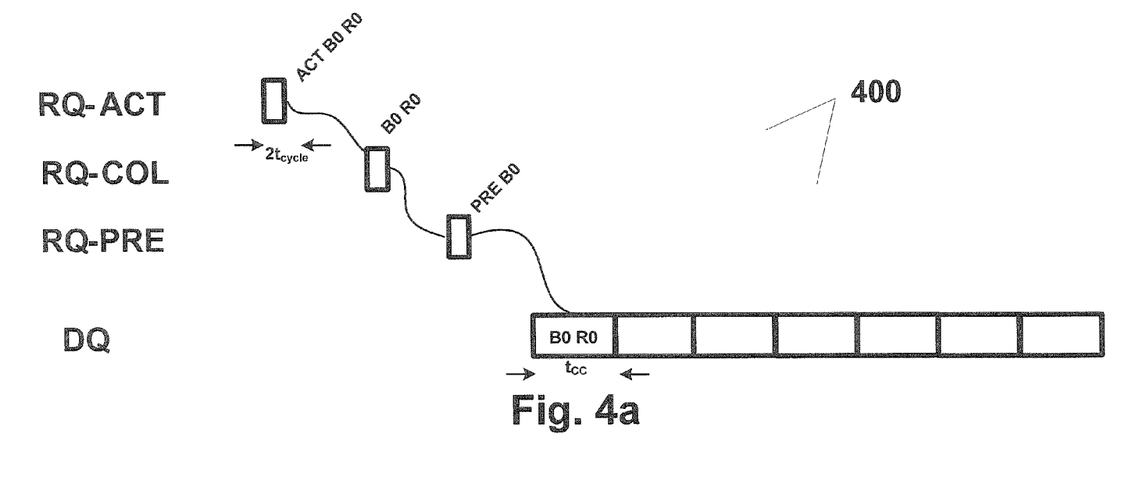
FIGS. 4a-b are timing diagrams illustrating operations of the integrated circuit memory device shown in FIG. 1.
Figure 4B:
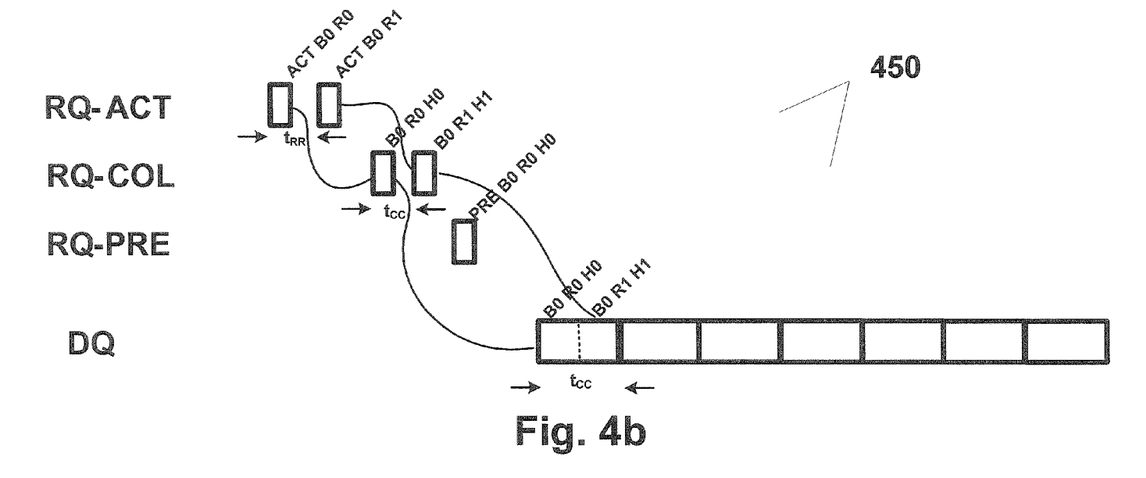

FIG. 4a is a timing diagram 400 illustrating a first mode of operation and FIG. 4b is a timing diagram 450 illustrating a second mode of operation of an integrated circuit memory device 100. Timing diagrams 400 and 450 provide various method embodiments of operating memory system 190, in particular integrated circuit memory device 100. One of ordinary skill in the art would appreciate that timing diagrams 400 and 450 described herein may include other or less memory transactions in alternate embodiments. In an embodiment, a memory transaction between integrated circuit memory device 100 and master device 130 is a collection of request packets used to complete access to one or more memory banks. A request packet represents one or more signals asserted at particular bit windows on particular signal lines on interconnects DQ and RQ in an embodiment.

While certain timing constraints are illustrated in FIGS. 4a and 4b, as one of ordinary skill in the art would appreciate, other timing constraints are possible in other embodiments. In an embodiment, a cycle time interval $t_{cycle}$ between clock edges of a clock signal is approximately 1.25 ns. A column cycle time interval $t_{CC}$ is defined as two cycle time intervals $t_{cycle}$ in an embodiment. A row cycle time interval $t_{RC}$ is an amount of time to between successive ACT commands to the same memory bank. A time interval $t_{RR}$ is an amount of time between ACT commands to different memory banks. A column cycle time interval $t_{CC}$ is the interval of time between successive RD commands, or between successive WR command to the same memory bank or different memory banks.

In a first mode of operation (accessing an entire row in a physical memory bank), an ACTIVATE (ACT) B0 R0, READ (RD) (included in a COLUMN (COL) B0 R0 request packet) and PRECHARGE (PRE) B0 commands are asserted on interconnect RQ during particular time intervals by master device 130. One of ordinary skill in the art would appreciate that commands described herein may be included in request packets that include control information such as a memory bank address (physical or virtual), column address and/or row address of storage arrays to be accessed along with other control information in various embodiments. Also, one of ordinary skill in the art would appreciate that other or similar commands and or request packets may be asserted in other embodiments.

An ACT B0 R0 command activates a selected row R0 at a specified memory bank B0 (such as row 201b of memory bank 201 shown in FIG. 2). Row decoder 122 selects or activates a row R0 in response to a row address in or associated with the ACT B0 R0 command. A COL B0 R0 request packet may include either a WRITE (WR) or RD commands with associated specified column addressees (such as the column addresses for accessing data 203 in row 201b shown in FIG. 2). Column decoder 123 accesses one or more columns in row R0 in response to one or more column addresses. A PRE B0 command is then asserted in an embodiment. In the case of a RD command, data from memory bank B0 and row R0 (B0 R0) is then provided to interconnect DQ from a plurality of sense amplifiers, such as sense amplifiers 202.

In a second mode of operation (accessing data from two different halves of two different rows), two ACT B0 R0 and B0 R1, two RD (two COL B0 R0 H0 and B0 R1 H1 request packets) and one PRE B0 R0 H0 commands are asserted on interconnect RQ during particular time intervals by master device 130. In an alternate embodiment, two column addresses or two row addresses are included in a single request packet. In the second mode of operation, a mode control signal 125 has been asserted to column decoder 123 and row decoder 122 so the respective decoders can access two different halves of two different rows (B0 R0 H0 and B0 R1 H1) in a physical memory bank per column cycle time interval $t_{CC}$ in response to the two row and at least two column addresses. In an alternate embodiment, a single ACT command with two associated row addresses to be activated may be asserted. Likewise, in an alternate embodiment, a single RD command with two different column addresses for the two different halves may be asserted. A PRE B0 R0 H0 command is then asserted in an embodiment that precharges or closes a portion of an activated row or clears a plurality of sense amplifiers (such a first half H0 of memory bank B0 in row R0 or left half of row 201b shown at FIG. 3). In an embodiment, A PRE B0 R0 H0 includes a plurality of precharge addresses. Data from memory bank B0 and row R0 (B0 R0) is then provided to interconnect DQ from a plurality of sense amplifiers, such as sense amplifiers 202.

Figure 5:
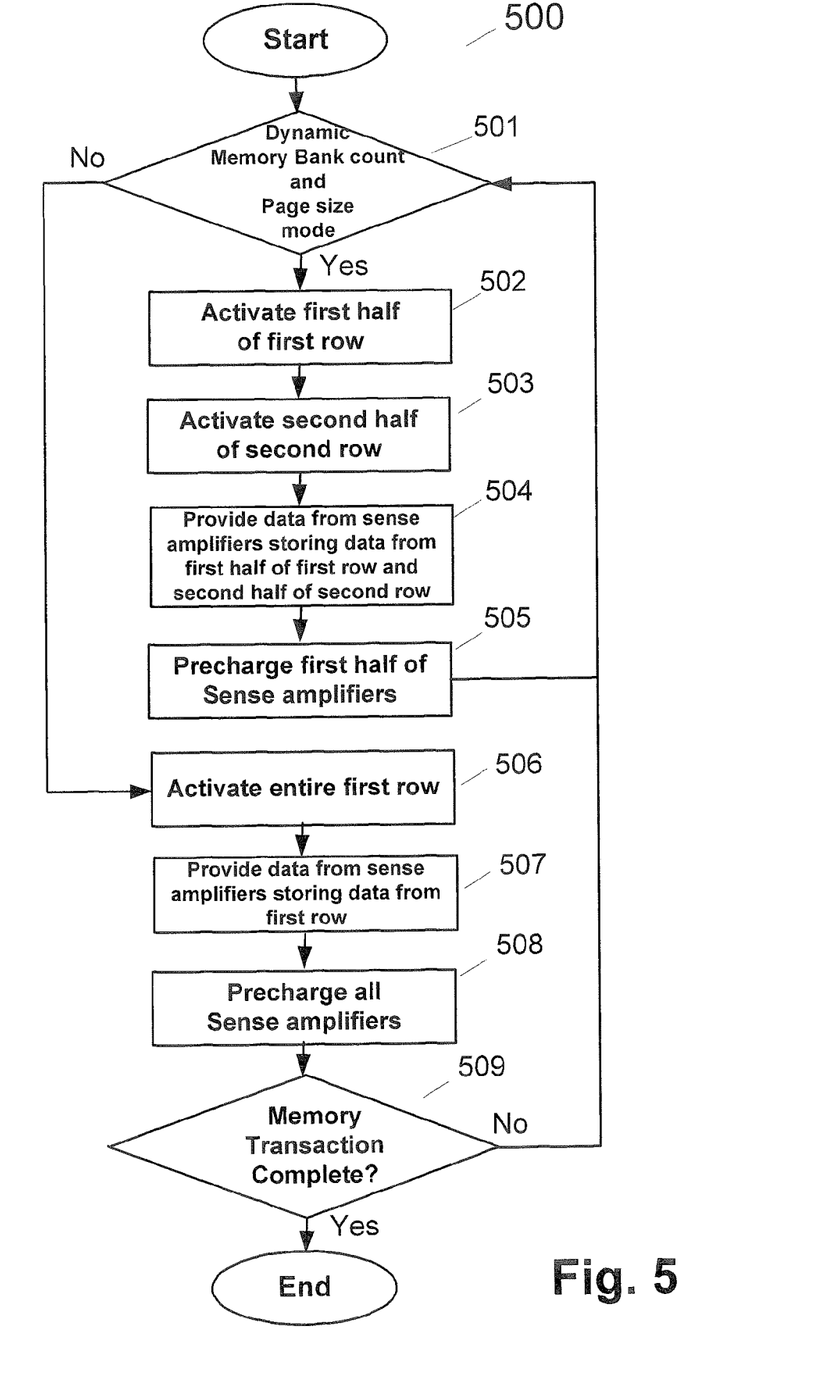
FIG. 5 is a flow chart illustrating a method of operation of the integrated circuit memory device shown in FIG. 1.

FIG. 5 is a flow chart illustrating a method 500 of operating an integrated circuit memory device shown in FIG. 1. In embodiments, steps or logic blocks illustrated in FIG. 5 are carried out by hardware, software, a user or a combination thereof. In alternate embodiments, the circuit and software components illustrated in FIGS. 1-3, carry out the steps illustrated in FIG. 5. As one of ordinary skill in the art would appreciate, more or less steps that are not shown may be included in various embodiments. Also, while method 500 is described in sequential steps, one of ordinary skill in the art would appreciate that method steps or logic blocks of method 500 are completed very quickly or almost instantaneously.

A determination is made whether to enter a dynamic memory bank count and page size mode in logic block 501. If the mode is not entered, control transfers to logic block 506. If the dynamic memory bank count and page size mode is entered, a first half of a selected first row is activated as shown in logic block 502. A second half of a second selected row is activated as shown in logic block 503. In an embodiment, the first row is different from the second row. Data from the two different rows is provided to a plurality of sense amplifiers and available at an integrated circuit memory device interface as shown in logic block 504. In an embodiment, a subset or a first plurality of sense amplifiers and a first half of the first selected row is precharged as shown in logic block 505. In an alternate embodiment, a second half of the second selected row or both selected rows are precharged as illustrated by logic block 505. Control is then transferred to logic block 501 where logic blocks 502-505 are repeated as long as a dynamic memory bank count and page size mode is selected.

In logic block 506 an entire first selected row is activated. Data stored in the first selected row is then transferred to a plurality of sense amplifiers and available at an integrated circuit memory device interface as shown in logic block 507. A plurality of sense amplifiers is precharged in logic block 508. A determination is made whether a memory transaction is complete in logic block 509. If memory transactions are complete, method 500 ends; otherwise, logic blocks 501-509 may be repeated.

Figure 6:
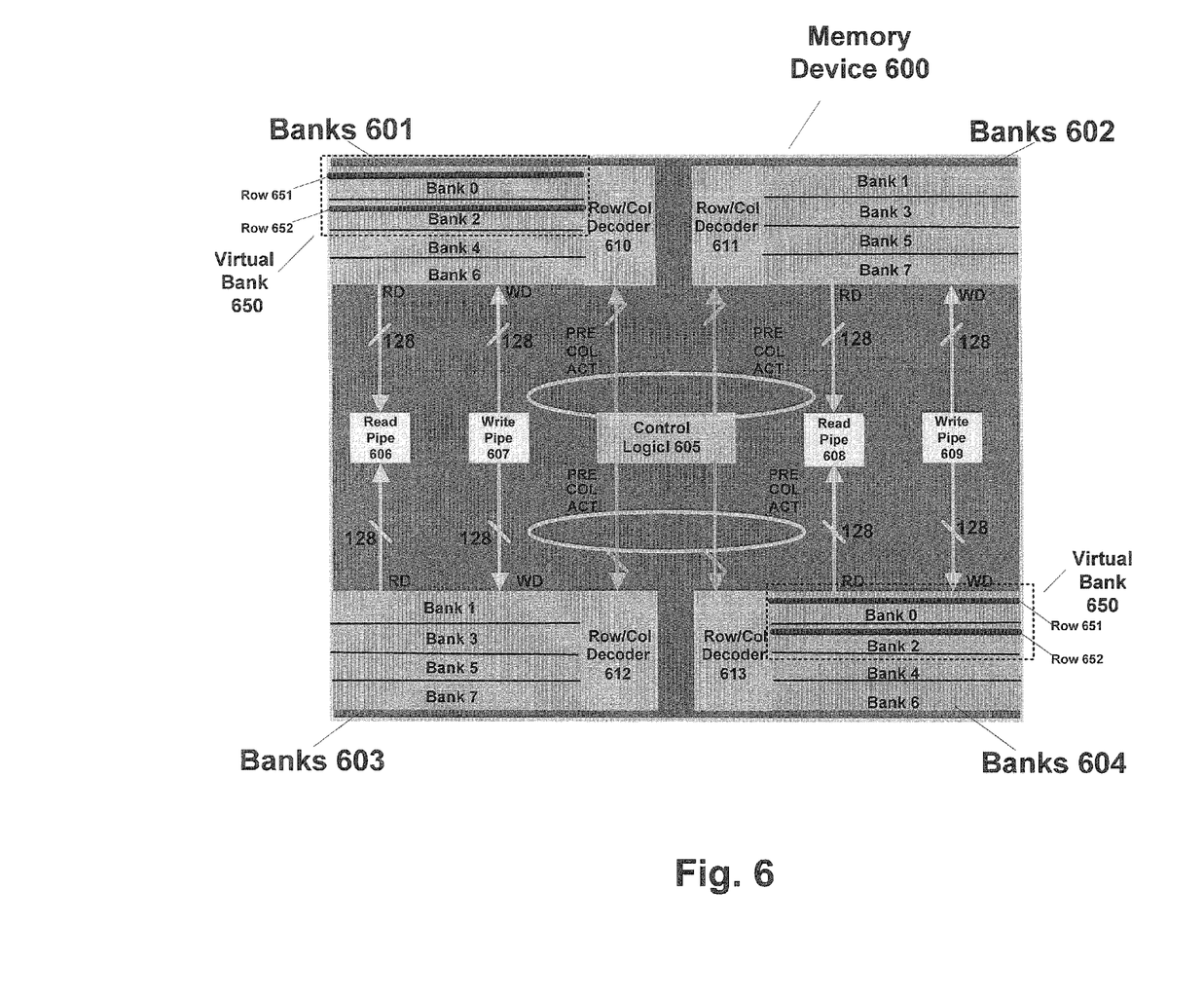
FIG. 6 is a simplified block diagram of an integrated circuit memory device having eight memory banks.

FIG. 6 is a simplified block diagram of the integrated circuit memory device 600 that forms a single virtual memory bank 650 from two physical memory banks 0 and 2 in memory banks 601 and 604. In an alternate embodiment, physical memory banks 0 and 2 as well as physical memory banks 1 and 3 in memory banks 601 and 602, respectively, form a single virtual memory bank. Integrated circuit memory device 600 operates similar to integrated circuit memory device 100 described above. Rows 651 and 652 of memory banks 0 and 2 in memory banks 601 and 604 are selected and activated during a time interval. In an embodiment, rows 651 and 652 are the same rows in two different physical memory banks 0 and 2. Reading and writing, or column accesses, is then directed toward one physical memory bank (either memory bank 0 or memory bank 1). Accordingly, data from a first half of a row 651 in memory bank 0 of memory banks 601 can be accessed by interconnect DQ-A and data from a second half of row 652 in memory bank 2 of memory banks 604 can be accessed by interconnect DQ-B. As one of ordinary skill in the art would appreciate, the memory banks used in typical memory core embodiments may be partitioned into two physical memory banks through modifications, requiring no or a small amount of additional circuitry, of the existing column and row decoder logic. By using a dynamic bank count and page size as described herein, a memory system 190 can take advantage of the availability of increased physical memory banks and decreased page size.

In an embodiment, integrated circuit memory device 600 is used instead of integrated circuit memory device 100 in memory system 190 described above. In particular, FIG. 6 illustrates integrated circuit memory device 600 having a plurality of memory banks 601, 602, 603 and 604. In an embodiment, each of the memory banks 601, 602, 603 and 604 includes four memory banks. In an embodiment, memory banks 601(even memory banks 0, 2, 4, 6) and 602 (odd memory banks 1, 3, 5, 7) are grouped and memory banks 603 (odd memory banks 1, 3, 5, 7) and 604 (even memory banks 0, 2, 4, 6) are grouped. In an embodiment, a row or page in like referenced memory banks may be simultaneously accessed. For example, a page may be accessed from even memory bank B0 of memory bank 601 and even memory bank B0 of memory bank 604. In effect, two separate memory banks operate as one memory bank in accessing a page.

Memory transactions, in particular memory commands, are input to control logic 605 from interconnect RQ. Control logic 605 includes receiver 108, pipeline register 102 and circuitry 105 as seen in FIG. 1 in an embodiment. Control logic 605 then provides memory control signals, including column and row addresses, to row/col decoders 610, 611, 612 and 613. In an embodiment, each row/col decoder 610, 611, 612 and 613 operates similarly to interconnect A, row decoder 122 and column decoder 123 shown in FIG. 1. Likewise, read pipes 606 and 608 coupled to memory banks 601/603 and 602/604 operate similar to sense amplifiers 121, circuitry 106, pipeline register 103 and transmitter 109 shown in FIG. 1. Also, write pipes 607 and 609 coupled to memory banks 601/603 and 602/604 operate similar to sense amplifiers 121, pipeline register 104, circuitry 107 and receiver 110.

In an embodiment, memory banks 601 and 603, as well as memory banks 602 and 604, have dedicated read and write pipes for reading and writing data from and to storage cells. This grouping allows for master device 130 to provide alternate commands to alternate groups of memory banks that enable full external interconnect or bus DQ utilization. Read data is output and interleaved between the different groups of memory banks in an embodiment.

In an embodiment, a first data interconnect DQ-A having 8 data signal lines is coupled to read pipe 606 and write pipe 607. Read pipe 606 and write pipe 607 are connected to memory banks 601 and 603 by 128 internal I/O lines. A second data interconnect DQ-B having 8 data signal lines is coupled to read pipe 608 and write pipe 609. Read pipe 608 and write pipe 609 are connected to memory banks 602 and 604 by read 128 internal I/O lines. A control interconnect RQ is also coupled to an interface of integrated circuit memory device 600 to provide control signals to control logic 605.

In an embodiment, memory banks 601 and 603, as well as memory banks 602 and 604, are able to operate independently. In other words, no timing constraint is imposed when one group of memory banks may be accessed relative to the other group of memory banks. This independent nature of memory bank groups is derived from the fact that the memory groups are isolated from each other. The memory groups are sufficiently decoupled from each other from an electrical noise standpoint that access to one memory group does not corrupt data in another memory group. More specifically, the activation of one set of sense amplifiers associated with a memory group does not corrupt the other set of sense amplifiers associated with the other memory group, regardless of the timing of the ACT commands. In an embodiment, electrical isolation between memory groups is achieved by positioning an interface between memory groups.

The foregoing description of the preferred embodiments of the present application has been provided for the purposes of illustration and description. It is not intended to be exhaustive or to limit the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit memory device, comprising:
    a storage array having an adjustable number of accessible memory banks;
    a row of sense amplifiers to access storage cells in the storage array; and memory access control circuitry providing a first number of accessible memory banks and a first page size in the integrated circuit memory device in a first mode of operation, and providing a second number of accessible memory banks and a second page size in the integrated circuit memory device in a second mode of operation, the memory access control circuitry including logic circuitry to adjust the number of accessible memory banks in the integrated circuit memory device, and to adjust the page size of the integrated circuit memory device, wherein the second number is different from the first number, and the first page size and second page size correspond to distinct numbers of accessible storage cells in the storage array that are accessible as a respective page.

2. The integrated circuit memory device of claim 1, including circuitry to transfer data from one or more rows of storage cells in the storage array to the row of sense amplifiers in the integrated circuit memory device in accordance with a mode of operation of the integrated circuit memory device, wherein the mode of operation is selected from the set consisting of the first mode and the second mode.

3. The integrated circuit memory device of claim 2, wherein the memory access control circuitry is configured to transfer, while performing a memory access operation in the second mode of operation, first data from a first row of storage cells in the storage array to a first plurality of the sense amplifiers, and to transfer second data from a second row of storage cells to a second plurality of the sense amplifiers.

4. A method for operation of an integrated circuit memory device, comprising:
transitioning between a first mode of operation, providing a first number of accessible memory banks and a first page size in the integrated circuit memory device, and a second mode of operation, providing a second number of accessible memory banks and a second page size in the integrated circuit memory device, including:
adjusting the number of accessible memory banks in the integrated circuit memory device; and
adjusting the page size of the integrated circuit memory device;
wherein the second number is different from the first number, and the first page size and second page size correspond to distinct numbers of accessible storage cells in the storage array that are accessible as a respective page.

5. The method of claim 4, further comprising:
while performing a memory access operation, transferring data from one or more rows of storage cells to a row of sense amplifiers in the integrated circuit memory device in accordance with a mode of operation of the integrated circuit memory device, wherein the mode of operation is selected from the set consisting of the first mode and the second mode.

6. The method of claim 5, including, in the second mode of operation, while performing the memory access operation, transferring first data from a first row of storage cells to a first plurality of the sense amplifiers, and transferring second data from a second row of storage cells to a second plurality of the sense amplifiers.

7. An integrated circuit memory device, comprising:
an adjustable number of accessible memory banks;
means for transferring data to a plurality of sense amplifiers; and
means for transitioning between a first mode of operation, providing a first number of accessible memory banks and a first page size in the integrated circuit memory device, and a second mode of operation, providing a second number of accessible memory banks and a second page size in the integrated circuit memory device, including means for adjusting the number of accessible memory banks in the integrated circuit memory device, and means for adjusting the page size of the integrated circuit memory device, wherein the second number is different from the first number, and the first page size and second page size correspond to distinct numbers of accessible storage cells in the storage array that are accessible as a respective page.

8. The integrated circuit memory device of claim 7, wherein the means for transitioning operates in response to a mode control signal.

9. The integrated circuit memory device of claim 8, wherein the mode control signal is provided from an initialization register.

10. The integrated circuit memory device of claim 8, wherein the mode control signal is generated by a master device.

11. The integrated circuit memory device of claim 10, wherein the master device generates the mode control signal from a power consumption value.

12. The integrated circuit memory device of claim 1, wherein the memory access control circuitry adjusts the number of accessible memory banks in the integrated circuit memory device and the page size of the integrated circuit memory device in response to a mode control signal.

13. The integrated circuit memory device of claim 12, wherein the mode control signal is provided from an initialization register.

14. The integrated circuit memory device of claim 12, wherein the mode control signal is generated by a master device.

15. The integrated circuit memory device of claim 14, wherein the master device generates the mode control signal from a power consumption value.

16. The method of claim 4, wherein the transitioning between the first mode of operation and the second mode of operation is performed in response to a mode control signal.

17. The method of claim 16, wherein the mode control signal is provided from an initialization register.

18. The method of claim 16, wherein the mode control signal is generated by a master device.

19. The method of claim 18, wherein the master device generates the mode control signal from a power consumption value.

* * * * *